| United States Patent [19] | [11] | Patent Number: | 4,784,923 |
|---|---|---|---|
| Graham | [45] | Date of Patent: | Nov. 15, 1988 |

[54] HARD METAL ALLOY WITH SURFACE REGION ENRICHED WITH TANTALUM, NIOBIUM, VANADIUM OR COMBINATIONS THEREOF AND METHODS OF MAKING THE SAME

[75] Inventor: Donald E. Graham, St. Clair Shores, Mich.

[73] Assignee: Carboloy Inc., Warren, Mich.

[21] Appl. No.: 876,189

[22] Filed: Jun. 19, 1986

Related U.S. Application Data

[63] Continuation-in-part of Ser. No. 767,127, Aug. 19, 1985, abandoned.

[51] Int. Cl.$^4$ .......................... B32B 9/00; B32B 19/00
[52] U.S. Cl. ..................... 428/698; 427/249; 427/255; 427/255.2; 427/376.1
[58] Field of Search ............ 427/249, 255, 255.2, 427/376.1; 148/13, 13.1, 31.5; 428/698, 689

[56] References Cited

U.S. PATENT DOCUMENTS

| Re. 28,485 | 7/1975 | Rix et al. | 427/249 |
|---|---|---|---|
| 3,999,954 | 12/1976 | Kolaska et al. | 29/182.7 |
| 4,018,631 | 4/1977 | Hale | 427/379 |
| 4,264,682 | 4/1981 | Fuyama et al. | 427/249 |
| 4,269,899 | 5/1981 | Fuyama et al. | 427/249 |
| 4,282,289 | 8/1981 | Kullander et al. | 427/249 |
| 4,399,168 | 8/1983 | Kullander et al. | 427/249 |

FOREIGN PATENT DOCUMENTS

| 952383 | 8/1974 | Canada | 427/249 |
|---|---|---|---|
| 48-32734 | 5/1973 | Japan | 427/249 |
| 37838 | 3/1976 | Japan | 427/249 |
| 97508 | 8/1976 | Japan | 427/379 |
| 153716 | 12/1979 | Japan | 428/698 |

*Primary Examiner*—Sadie L. Childs
*Attorney, Agent, or Firm*—Hedman, Gibson, Costigan & Hoare

[57] ABSTRACT

Disclosed is a method of producing a hard metal alloy with a surface region enriched with a first component being at least one of the carbides, nitrides and carbonitrides of tantalum, niobium, vanadium or combinations thereof wherein the atomic percent ratio of a second component present in the alloy and being selected from the carbides, nitrides and carbonitrides of titanium, hafnium and zirconium and combinations thereof to the first component is in the range of from 0 to about 1.5. Also disclosed are hard metal alloys having said surface enriched region which can be used to produce cutting tools which are resistant to galling and crater formation.

22 Claims, No Drawings

HARD METAL ALLOY WITH SURFACE REGION ENRICHED WITH TANTALUM, NIOBIUM, VANADIUM OR COMBINATIONS THEREOF AND METHODS OF MAKING THE SAME

This is a continuation-in-part application of U.S. Ser. No. 767,127 filed Aug. 19, 1985, now abandoned.

FIELD OF THE INVENTION

The present invention is directed to cemented carbide hard metal alloys and to a method of producing a cemented carbide alloy, particularly suited for use as a cutting tool. The alloy has a surface region enriched with at least one carbide, nitride and carbonitride of the Group V(B) elements (i.e., tantalum, niobium, vanadium). Such alloys are used for cutting tools which are resistant to damage due to galling and the formation of craters. Such tools are particularly suited for the machining of hard metal alloys including uranium alloys, high temperature alloys and ferrous materials such as steels and cast irons.

BACKGROUND OF THE INVENTION

It is known in the art that the inclusion of Group V(B) compounds (e.g. tantalum carbide) to cemented carbide alloys used for cutting tools improves the wear resistance of the tools and also prevents tool failure due to galling and crater formation. Alloys containing up to 50% by weight of tantalum carbide dispersed throughout the alloy exhibit significantly better wear performance than alloys which do not contain tantalum carbide especially in the machining of depleted uranium alloys, high temperature alloys and stainless steels. However, because tantalum is a relatively expensive metal, alloys containing large amounts of tantalum are impractical and have not gained commercial acceptance.

Prior efforts to prevent galling and crater-type failure have focused on providing the alloys with at least one surface coating of, for example, titanium nitride, titanium carbide, aluminum oxide or combinations thereof. The surface coating is typically applied by chemical vapor deposition techniques known to those skilled in the art. Such coated hard metal alloys extend tool life in the machining of ferrous materials such as steels and cast irons. However, these coatings have not resulted in improved tools for the machining of uranium alloys and many high temperature alloys and thus the problems of galling and crater formation are still of concern to the industry.

It is also known in the art that hard metal alloys containing compounds of the Group IV(B) metals (e.g., titanium carbide) are advantageous because they have better cutting characteristics including superior crater and deformation resistance. Such alloys are also less expensive to produce and are lighter in weight. It would therefore be desirable and a significant advance in the industry to provide a hard metal alloy which incurs less galling and crater-type failure especially in the machining of those alloys described above which have had limited success using known coatings applied by chemical vapor deposition. It would also be desirable to reduce galling and crater-type failures in alloys which contain sufficient amounts of Group IV(B) compounds to thereby obtain the benefit of the superior cutting characteristics associated with such compounds.

The present invention was arrived at by considering that galling and crater formation occur at or near the surface of the tool during machining. Since Group V(B) compounds (e.g., tantalum carbide) are known to inhibit such deleterious formations, it was deemed desirable to form a surface region enriched with these compounds in alloys which contain Group IV(B) compounds and those that do not. In the course of this investigation, applicant discovered that the Group IV(B) compounds, especially titanium carbide, inhibit the migration of the Group V(B) compounds to the surface of the hard metal alloy. This discovery led to the present invention wherein a hard metal alloy contains at least one Group V(B) compound and optionally at least one Group IV(B) compound wherein the ratio of the atomic percent of the Group IV(B) compounds to the atomic percent of the Group V(B) compounds is from 0 to about 1.5. Within this critical range, there is sufficient migration of the Group V(B) compounds to the surface of the alloy to obtain the desired objects of the present invention.

Previous work has been performed on alloy compositions containing both Group V(B) and Group IV(B) compounds. Typically these alloys have been treated to form surface regions enriched with binder metals (e.g., cobalt and tungsten carbide). However, prior to the present invention, no one has recognized the criticality of employing alloy compositions containing Group V(B) and Group IV(B) compounds in the above-mentioned range and thereby obtain a surface region enriched with Group V(B) compounds especially in alloy compositions containing Group IV(B) compounds.

For example, U.S. Pat. No. 3,999,954 (Kolaska et al.) describes the production of a wearresistant hard metal alloy containing tungsten carbide, tantalum carbide, titanium carbide and a binder metal such as cobalt. A surface coating of titanium carbide is applied by customary chemical vapor deposition techniques. Thereafter the alloy is heated under conditions of temperature and pressure sufficient to cause the cobalt to migrate to the surface. Intermediate coating layers containing binder metal are also described.

U.S. Pat. No. 4,018,631 (Hale) describes a process for forming an oxidized coating on a cemented carbide alloy containing tungsten carbide, tantalum carbide, titanium carbide and cobalt.

U.S. Pat. No. 4,282,289 (Kullander et al.) discloses a process for the production of cemented carbide products by treating the substrate to form a carbide, nitride or carbonitride coating and during or after such treatment, adding a sulfide or nitride gas to form sulfide and/or nitride portions on or in the coating.

Kullander et al., U.S. Pat. No. 4,399,168 discloses a method of heat treating a coated substrate at a temperature of at least about the melting point of the binder phase to diffuse the binder from the substrate into the coating and then applying a second coating which in turn is treated with an oxygen-, nitrogen- or sulfur-containing gas.

All of the aforementioned U.S. Patent citations are incorporated herein by reference.

The prior art methods mentioned above utilize alloys containing Group V(B) compounds (e.g., tantalum carbide) and Group IV(B) compounds (e.g., titanium carbide) and subject the alloys to temperature and pressures which enable a binder metal such as cobalt and tungsten carbide to diffuse to the surface. None of the references teach a Group V(B) compound enriched surface region (e.g., a surface region enriched with tantalum carbide) nor is there any teaching of the criticality of employing applicant's ratio of the atomic percent of Group IV(B) compounds to the atomic percent of Group V(B) compounds in the range of from 0 to about 1.5 to thereby obtain a surface region enriched with the Group V(B) compounds.

Re. Pat. No. 28,485 (Rix et al.) exemplifies a hard metal body containing a tantalum compound in the absence of a Group IV(B) compound. However, the method described in this patent requires heating the alloy to temperatures (e.g., 1000° C.) well below the temperature needed to diffuse tantalum carbide to the surface of the alloy. Indeed, the patent specifically teaches that the surface area is not formed from a solid solution phase and thus tantalum carbide can not migrate to the surface under the Rix et al. process parameters.

It is therefore an object of the present invention to provide a method of producing a cemented carbide hard metal alloy with or without the presence of Group IV(B) compounds having a surface region enriched with the carbides, nitrides and carbonitrides of tantalum, niobium and vanadium or combinations thereof.

It is a further object of the invention to produce a cemented carbide hard metal alloy which exhibits superior resistance to galling and crater formation when used as a cutting tool to machine uranium alloys, high temperature alloys and ferrous materials.

SUMMARY OF THE INVENTION

The present invention is directed to a comented carbide hard metal alloy having a surface region enriched with at least one Group V(B) compound selected from the carbides, nitrides and carbonitrides of tantalum, niobium, vanadium or combinations thereof. Such alloys are made by a process wherein the alloy, prior to formation of the surface enriched region contains at least one Group V(B) compound and optionally at least one Group IV(B) compound in an atomic percent ratio of the latter to the former in the range of 0 to about 1.5. The alloy is subjected to conditions of heat and pressure wherein the Group V(B) compounds migrate to the surface of the alloy to form the surface enriched region.

DETAILED DESCRIPTION OF THE INVENTION

The hard metal alloys of the present invention include cemented carbides which are materials containing carbide crystals cemented together with an appropriate binder which adheres to the carbide crystals. The cemented carbides include, for example, alloys containing a predominant amount of tungsten carbide and a suitable binder material such as cobalt, nickel, iron and combinations thereof. Particularly preferred are cobalt, iron-nickel, iron and nickel.

The alloy may also contain one or more Group IV(B) compounds selected from the carbides, nitrides and carbonitrides of titanium, hafnium and zirconium. Titanium carbide is especially preferred as the Group IV(B) compound.

In accordance with the invention, the ratio of the atomic percent of the Group IV(B) compounds to the atomic percent of the Group V(B) compounds present in the alloy prior to the formation of the surface enriched region is in the range of from 0 to about 1.5.

An example of a hard metal alloy employed in the present invention is one containing a predominant amount of tungsten carbide, tantalum carbide, cobalt and optionally titanium carbide. It is preferred to employ an amount of tantalum carbide in the alloy prior to heating of at least about 2.5% by weight.

The process of the present invention provides a surface enriched region of tantalum, niobium, vanadium or combinations thereof and comprises depositing, by chemical vapor deposition, a layer made up of at least one of the carbides, nitrides and carbonitrides of titanium, hafnium and zirconium on the surface of the hard metal alloy described above, to a thickness of about 1 to about 5 microns. The layered hard metal alloy is then heated to a temperature and for a time sufficient to enable the compounds of tantalum, niobium, vanadium or combination thereof to migrate to the surface of the alloy to thereby form a surface region enriched with the desired material. The amount of the compounds containing tantalum, niobium, vanadium or combinations thereof in the surface enriched region at the conclusion of the heating step should, preferably, be at least 8% by weight. The desired level of these compounds in the surface enriched region can be obtained if the amount of these elements in the core region prior to heating is at least 2.5% by weight, preferably 4 to 25% by weight.

The temperature employed in the heat treatment to diffuse the Group V(B) compounds from the core to the surface of the alloy should be sufficient to melt the binder metal, typically at least 1290° C. The heating step is preferably performed under vacuum conditions (e.g. about 0.2 Torr). The thickness of the surface enriched region is preferably about 4 to 6 microns.

The first step of the process is to deposit the surface layer by chemical vapor deposition. Chemical vapor deposition is typically accomplished by the reduction of metal halides (e.g., $TiCl_4$) in the presence of at least one other reactant gas (e.g., $CH_4$, $N_2$, etc.) at the surface of the heated substrate. Titanium carbide, titanium nitride and titanium carbonitride are preferred materials for forming the initial surface layer.

The resulting layered hard metal alloy is then heated to a temperature of at least 1290° C., preferably from 1290° C. to about 1500° C., and most preferably from about 1370° C. to about 1450° C. The length of time of the heating step is approximately inversely related to the temperature. For example, if heating is conducted at a temperature of about 1370°-1450° C. the length of the reaction should be about 6 to 2 hours. The preferred conditions of heating are about 1420° C. for about 2 hours.

The following examples are submitted for illustrative purposes only and are not meant to limit or any way redefine the invention set forth in the claims appended hereto.

EXAMPLE 1

A cemented carbide hard metal alloy (Sample 1) containing 85.5% by weight (77.4 atomic %) of tungsten carbide, 2.5% by weight (7.2 atomic %) of titanium carbide, 6% by weight (5.9 atomic %) of tantalum carbide and 6% by weight (9.5 atomic %) of cobalt was coated to a depth of 3 microns with titanium carbide by chemical vapor deposition. The deposition was carried out at the surface of the hard metal alloy at atmospheric pressure and at a temperature of 1025° C. by the reduction of $TiCl_4$ and $CH_4$ having a concentration of 4% and 5% by volume, respectively.

The layered alloy was then heated to a temperature of 1420° C. for 2 hours and the resulting product was X-rayed to determine the lattice spacings. As shown in Table 1 the lattice spacing of the hard metal alloy produced in accordance with the present invention was 4.37 Å. The alloy had an atomic % ratio of titanium carbide to tantalum carbide of about 1.22.

EXAMPLE 2

A cemented carbide hard metal alloy (Sample 2) having the same composition as Sample 1 was coated with titanium nitride under the same deposition conditions as in Example 1 using $TiCl_4$ and $N_2$ having a concentration of 4% and 33%, respectively. The coated alloy was heat treated and measured for lattice spacings in the same manner as in Example 1. The TiC:TaC atomic % ratio prior to the heat treatment was 1.22. As shown in Table 1, the lattice spacing of Sample 2 was 4.35 Å.

Samples of substantially pure titanium nitride, titanium carbide and tantalum carbide, respectively were tested to determine the lattice spacings of the individual compounds. The results are shown in Table 1. As shown in Table 1, the titanium carbide and titanium nitride coated alloys produced in accordance with the present invention, exhibited higher lattice spacings (4.37 and 4.35 Å) than the corresponding individual compounds (4.33 and 4.24 Å) indicating the presence of tantalum carbide at the surface. This is confirmed by the lattice spacing of pure tantalum carbide which is 4.46 Å.

TABLE 1
LATTICE SPACING TESTS

| SAMPLE | MATERIAL | LATTICE SPACING (ANGSTROMS) |
|---|---|---|
| 1 | TiC coated alloy | 4.37 |
| 2 | TiN coated alloy | 4.35 |
| Control | TiN | 4.24 |
| Control | TiC | 4.33 |
| Control | TaC | 4.46 |

EXAMPLE 3

Three hard metal alloys (Samples 3-5) containing only tungsten carbide, tantalum carbide and cobalt and one hard metal alloy (Sample 6) containing tungsten carbide, tantalum carbide, titanium carbide and cobalt having the atomic percent concentrations shown in Table 2 were coated and heat treated in the same manner as in Example 1 and X-rayed to determine lattice spacings. The results are shown in Table 3. The atomic percent ratio of Samples 3-6 fall within the range of 0 to about 1.5 in accordance with the present invention wherein each sample exhibited a bronze-gold colored exterior surface indicating the presence of a tantalum enriched surface region.

Three control samples having the compositions shown in Table 2 and having an atomic % ratio of titanium carbide to tantalum carbide falling outside of the range of 0 to about 1.5 were prepared under the same conditions as Sample 3-6. The atomic % ratios and lattice spacings are shown in Table 3.

Each of the control samples exhibited a dull to dark gray surface color indicating the absence of any significant amounts of tantalum carbide in the surface region.

TABLE 2

| SAMPLE | COMPOSITION (atomic percent) | | | |
|---|---|---|---|---|
| | WC | TaC | TiC | Co |
| 3 | 65 | 22 | — | 13 |
| 4 | 69.6 | 20.4 | — | 9.9 |
| 5 | 89 | 4.2 | — | 6.8 |
| 6 | 64.9 | 8 | 10.8 | 16.3 |
| Control | 57.7 | 10 | 20.4 | 12 |
| Control | 53.6 | 10 | 30.4 | 6 |
| Control | 39.6 | 3 | 50.4 | 6.9 |

TABLE 3

| SAMPLE | ATOMIC % RATIO TiC/TaC | LATTICE SPACING (ANGSTROMS) |
|---|---|---|
| 3 | 0 | 4.435 |
| 4 | 0 | 4.432 |
| 5 | 0 | 4.414 |
| 6 | 1.35 | 4.363 |
| Control | 2.04 | 4.355 |
| Control | 3.04 | 4.351 |
| Control | 16.8 | 4.330 |

EXAMPLE 4

Sample 1 in the form of a TPG 322 style cutting tool having a 2-4 micron thick coating of titanium carbide deposited by chemical vapor deposition and a cutting tool made from the composition of Sample 3 (X7120 manufactured by the Carboloy Systems Division of The General Electric Company) was used to machine depleted uranium alloy made under the conditions shown in Table 4. Table 4 shows that the tantalum enriched surface alloys of the present invention perform very well in the machining of high temperature alloys.

TABLE 4
DEPLETED URANIUM MACHINING

| SPEED | 250 SFPM |
|---|---|
| FEED | 0.005 in./rev. |
| DEPTH OF CUT | 0.005 in. |
| TIME OF CUT | 60 min. |

| GRADE | AVERAGE WEAR (in.) |
|---|---|
| SAMPLE 3 | 0.005 |
| SAMPLE 1 | 0.006 |

What is claimed is:
1. A method of producing a cemented carbide hard metal alloy having a surface region enriched with at least one of the carbides, nitrides and carbonitrides of tantalum, niobium or vanadium or combinations thereof comprising:
(a) depositing by chemical vapor deposition a layer of at least one of the carbides, nitrides and carbonitrides of titanium, hafnium and zirconium on the surface of a cemented hard metal alloy to a thickness of about 1 to about 5 microns, said cemented carbide hard metal alloy comprising (i) a first component being at least one of the carbides, nitrides and carbonitrides of tantalum, niobium and vanadium or combinations thereof, (ii) at least one binder metal, and (iii) optionally, a second component being at least one of the carbides, nitrides and carbonitrides of titanium, hafnium and zirconium such that the atomic percent ratio of the optional second component to the first component is in the range of from 0 to about 1.5;

(b) heating the layered hard metal alloy to a temperature of at least about 1290° C. and for a time sufficient to form said surface enriched region.

2. The method of claim 1 wherein the thickness of the surface enriched region is about 4 to 6 microns.

3. The method of claim 1 wherein the layered hard metal alloy is heated to a temperature of about 1370° C. to about 1450° C.

4. The method of claim 3 wherein the heating step is carried out for about 6 to about 2 hours.

5. The method of claim 4 wherein the layered hard metal alloy is heated to a temperature of about 1420° C. for about two hours.

6. The method of claim 1 wherein said binder metal is selected from the group consisting of cobalt, iron-nickel, iron and nickel.

7. The method of claim 1 comprising depositing by chemical vapor deposition a layer of at least one compound selected from the group consisting of titanium carbide, titanium nitride and titanium carbonitride on the surface of the cemented carbide hard metal alloy.

8. The method of claim 1 wherein said hard metal alloy comprises tungsten carbide, titanium carbide, tantalum carbide and cobalt.

9. The method of claim 1 wherein prior to step (b) said cemented carbide hard metal alloy contains at least 2.5% by weight of said first component.

10. The method of claim 1 wherein the amount of said first component in said surface enriched region is at least 8% by weight.

11. The method of claim 1 wherein said second component is tantalum carbide.

12. The method of claim 8 wherein the amount of tungsten carbide is about 77.4 atomic %, the amount of titanium carbide is about 7.5 atomic %, the amount of tantalum carbide is about 5.9 atomic % and the amount of cobalt is about 9.5 atomic %.

13. The method of claim 1 wherein the hard metal alloy includes tungsten carbide and wherein the amount of tungsten carbide is 65 atomic %, the amount of tantalum carbide is 22 atomic % and the amount of cobalt is 13 atomic %.

14. A method of producing a cemented carbide hard metal alloy having a surface region enriched with at least one of the carbides, nitrides and carbonitrides of tantalum, niobium or vanadium or combinations thereof comprising:

(a) depositing by chemical vapor deposition a layer containing at least one compound selected from titanium carbide, titanium nitride and titanium carbonitride on the surface of a cemented carbide hard metal alloy to a thickness of about 1 to about 5 microns, said cemented carbide hard metal alloy comprising (i) a first component being at least one of the carbides, nitrides and carbonitrides of tantalum, niobium and vanadium or combinations thereof in an amount of at least 2.5% by weight, (ii) at least one binder metal selected from the group consisting of cobalt, nickel, iron-nickel and iron and (iii) optionally, a second component selected from titanium carbide, titanium nitride, titanium carbonitride, zirconium carbide, zirconium nitride and zirconium carbonitride such that the atomic % ratio of the optional second component to the first component is in the range of from 0 to about 1.5; and (b) heating the layered hard metal alloy to a temperature of about 1370° C. to about 1450° C. for about 6 to 2 hours to form said enriched surface region having a thickness of about 4 to 6 microns, wherein the amount of said first component in said surface enriched region is at least 8% by weight.

15. The method of claim 14 wherein said first component is tantalum carbide.

16. The method of claim 15 wherein the layered hard metal alloy is heated to a temperature of about 1420° C. for about two hours.

17. The method of claim 14 wherein prior to step (b), said cemented carbide hard metal alloy contains 4 to 25% by weight of said first component.

18. The method of claim 14 wherein said hard metal alloy comprises tungsten carbide, titanium carbide, tantalum carbide and cobalt.

19. The method of claim 18 wherein the amount of tungsten carbide is about 77.4 atomic % by weight, the amount of titanium carbide is about 7.2 atomic %, the amount of tantalum carbide is 5.9 atomic % and the amount of cobalt is 9.5 atomic %.

20. The method of claim 14 wherein the hard metal alloy contains tungsten carbide and wherein the amount of tungsten carbide is 65 atomic %, the amount of tantalum carbide is 22 atomic % and the amount of cobalt is 13 atomic %.

21. A cemented carbide hard metal alloy produced by the process of claim 1.

22. A cemented carbide hard metal alloy produced by the process of claim 14.

* * * * *